US011488809B2

(12) United States Patent
Yoo et al.

(10) Patent No.: US 11,488,809 B2
(45) Date of Patent: Nov. 1, 2022

(54) SUBSTRATE PROCESSING APPARATUS

(71) Applicant: Jusung Engineering Co., Ltd., Gwangju-si (KR)

(72) Inventors: Kwang Su Yoo, Gwangju-si (KR); Teugki Park, Gwangju-si (KR); Yong Hyun Lee, Seongnam-si (KR); Cheol Woo Chong, Seoul (KR)

(73) Assignee: Jusung Engineering Co., Ltd., Gwangju-si (KR)

( * ) Notice: Subject to any disclaimer, the term of this patent is extended or adjusted under 35 U.S.C. 154(b) by 0 days.

(21) Appl. No.: 16/496,903

(22) PCT Filed: Apr. 24, 2018

(86) PCT No.: PCT/KR2018/004708
§ 371 (c)(1),
(2) Date: Sep. 23, 2019

(87) PCT Pub. No.: WO2018/199582
PCT Pub. Date: Nov. 1, 2018

(65) Prior Publication Data
US 2020/0090911 A1    Mar. 19, 2020

(30) Foreign Application Priority Data
Apr. 24, 2017    (KR) .................. 10-2017-0052447

(51) Int. Cl.
*H01J 37/32*    (2006.01)
*C23C 16/50*    (2006.01)

(52) U.S. Cl.
CPC ........ *H01J 37/32651* (2013.01); *C23C 16/50* (2013.01); *H01J 37/3244* (2013.01);
(Continued)

(58) Field of Classification Search
CPC ........... H01J 37/32431; H01J 37/32458; H01J 37/32467; H01J 37/32477;
(Continued)

(56) References Cited

U.S. PATENT DOCUMENTS

| 5,603,196 A * | 2/1997 | Sohlstrom | ............ H05K 9/0001 174/385 |
| 9,039,864 B2 | 5/2015 | Baek et al. | |

(Continued)

FOREIGN PATENT DOCUMENTS

| CN | 105590824 A * | 5/2016 |
| CN | 105590824 A | 5/2016 |

(Continued)

OTHER PUBLICATIONS

English Machine translation of Wu (CN-105590824-A) retrieved from ESPACENET Oct. 9, 2020 (Year: 2020).*

(Continued)

*Primary Examiner* — Ram N Kackar
*Assistant Examiner* — Laureen Chan
(74) *Attorney, Agent, or Firm* — Andrew D. Fortney; Central California IP Group, P.C.

(57) ABSTRACT

A capacitively coupled plasma substrate processing apparatus includes: a process chamber which is exhausted to vacuum and provides a sealed internal space; a gas inflow pipe which is connected to the process chamber to provide a process gas into the process chamber; a gas distribution unit which is connected to the gas inflow pipe to inject the process gas flowing into the gas inflow pipe in the internal space; an impedance matching network which is disposed outside the process chamber and transfers an RF power of an RF power supply to the gas distribution unit; an RF connection line which connects an output of the impedance matching network to the gas inflow pipe or the gas distri- (Continued)

bution unit; and a shielding plate which is configured such that at least one of the RF connection line and the gas inflow pipe penetrates the shielding plate and includes a ferromagnetic material.

20 Claims, 8 Drawing Sheets

(52) U.S. Cl.
CPC .. *H01J 37/32091* (2013.01); *H01J 37/32183* (2013.01); *H01J 37/32724* (2013.01); *H01J 2237/002* (2013.01); *H01J 2237/3321* (2013.01); *H01J 2237/3323* (2013.01)

(58) Field of Classification Search
CPC ........... H01J 37/32623; H01J 37/32651; H01J 37/32091; H01J 37/32183; H01J 37/3244; H01J 37/32724; H01J 2237/002; H01J 2237/3321; H01J 2237/3323; H01J 37/32522; H01J 37/32357; C23C 16/50; C23C 16/5096; C23C 16/455; H05K 9/00; H05K 9/0001; H05K 9/0003; H05K 9/0073; H05K 9/0075; H05K 9/0081; H05K 9/0088
See application file for complete search history.

(56) References Cited

U.S. PATENT DOCUMENTS

| | | | |
|---|---|---|---|
| 9,398,732 B2 | 7/2016 | Do et al. | |
| 2005/0162249 A1* | 7/2005 | Simola | H05K 9/0001 335/301 |
| 2006/0024451 A1* | 2/2006 | Mungkekar | H01J 37/321 427/569 |
| 2008/0174324 A1* | 7/2008 | Yamazawa | H01J 37/32091 324/707 |
| 2010/0196626 A1* | 8/2010 | Choi | H01J 37/32091 427/569 |
| 2010/0245214 A1* | 9/2010 | Baek | H01J 37/32165 345/60 |
| 2011/0126405 A1* | 6/2011 | Baek | H01J 37/32577 29/825 |
| 2012/0000609 A1* | 1/2012 | Do | H01J 37/32568 156/345.48 |
| 2012/0236528 A1* | 9/2012 | Le | H05K 9/0088 361/818 |
| 2013/0071581 A1* | 3/2013 | Baek | H01J 37/32091 427/569 |
| 2014/0000810 A1* | 1/2014 | Franklin | H01L 21/306 156/345.48 |
| 2014/0131087 A1* | 5/2014 | Staebler | H05K 9/0001 174/391 |
| 2014/0209244 A1* | 7/2014 | Banna | H01J 37/3266 156/345.49 |
| 2014/0262044 A1* | 9/2014 | Yousif | H01J 37/32651 156/345.48 |
| 2015/0129131 A1* | 5/2015 | Li | H01J 37/32651 156/345.35 |
| 2015/0187615 A1* | 7/2015 | Daugherty | C23C 24/04 438/710 |
| 2016/0276230 A1* | 9/2016 | Nagorny | H01J 37/3211 |

FOREIGN PATENT DOCUMENTS

| | | | |
|---|---|---|---|
| JP | 03233085 A | * | 10/1991 |
| JP | 2002-252213 A | | 9/2002 |
| JP | 2004266268 A | | 9/2004 |
| JP | 2010206182 A | * | 9/2010 |
| KR | 19990032743 A | * | 5/1999 |
| KR | 100714882 B1 | | 4/2007 |
| KR | 1020120002795 A | | 1/2012 |
| KR | 2020120005287 U | | 7/2012 |
| KR | 101313705 A | | 9/2013 |
| KR | 1020150037137 A | | 4/2015 |
| KR | 1020150079484 A | | 7/2015 |
| KR | 20160078660 A | * | 7/2016 |
| KR | 1020160078660 A | | 7/2016 |

OTHER PUBLICATIONS

English Machine Translation of Kim (KR-20160078660-A) retrieved from ESPACENET Oct. 8, 2020 (Year: 2020).*
English Machine Translation Ishikawa (JP-03233085-A) retrieved from ESPACENET Oct. 9, 2020 (Year: 2020).*
English Machine translation of Yamada (JP-2010206182-A) retrieved from ESPACENET Apr. 5, 2021 (Year: 2021).*
English Machine Translation of Hong (KR-1999032743-A) retrieved from KIPO on Sep. 8, 2021 (Year: 2021).*
International Search Report and Written Opinion; International Searching Authority/KR dated Aug. 24, 2018 International Application No. PCT/KR2018/004708; 4 pgs.; International Searching Authority/Korean Intellectual Property Office; Daejeon, Republic of Korea.
Sang-Beom Kim et al.; "Electromagnetic Interference Shielding Material and Shielding Method Using the Same"; Abstract of KR1020150037137 (A); Apr. 8, 2015; https://worldwide.espacenet.com.
Office Action dated May 12, 2022 for Taiwan Patent Application No. 107113860; 5 pgs.; Taiwan Intellectual Property Office, Taiwan.
Office Action dated Apr. 4, 2022; Japanese Patent Application No. 2019-555024; 3 pgs.; Japan Patent Office, Tokyo, Japan.

* cited by examiner

Non-magnetic conductive shielding plate

Non-magnetic conductive plate/
ferromagnetic plate/
non-magnetic conductive plate

SUBSTRATE PROCESSING APPARATUS

CROSS-REFERENCE TO RELATED APPLICATIONS

This application is a continuation of and claims priority to PCT/KR2018/004708 filed on Apr. 24, 2018, which claims priority to Korea Patent Application No. 10-2017-0052447 filed on Apr. 24, 2017, the entireties of which are both hereby incorporated by reference.

TECHNICAL FIELD

The present disclosure relates to substrate processing apparatuses and, more particularly, to a capacitively coupled plasma substrate processing apparatus having magnetic field shielding and remanent magnetization functions using a high-permeability conductive ferromagnetic material.

BACKGROUND

A liquid crystal display (LCD) means a non-emission device in which a liquid crystal is inserted between an array substrate and a color filter substrate to obtain an image effect using its characteristics. Each of the array substrate and the color filter substrate is manufactured by depositing, patterning, and etching thin films on a transparent substrate, which is formed of glass or the like, several times. Recently, plasma enhanced chemical vapor deposition (PECVD) has been widely used to deposit thin films. In the PECVD, a chemical reaction between process gases is induced while the process gases are excited into a plasma state.

U.S. Patent Publication No, 2014/0262044 A1 discloses a substrate processing apparatus with improved magnetic shielding. In the substrate processing apparatus, an RF impedance matching network is shielded from an external static magnetic field such as Earth's magnetic field.

Korean Patent Publication No. 10-2015-0079484 discloses a component for a magnetically coated plasma processing apparatus. The component has a thickness greater than a skin depth and shields an electromagnetic wave. The magnetic coating is required for all parts and reduces an electric conductivity to reduce a grounding capability

SUMMARY

Example embodiments of the present disclosure provide an electromagnetic shielding box which provides remanent magnetization while effectively shielding a magnetic field and an electromagnetic field. The electromagnetic shielding box provides a side all and a top surface which are formed of a non-magnetic metal having a high electric conductivity for efficient RF shielding in an RF frequency band used in a capacitively coupled plasma, and a bottom surface of the electromagnetic shielding box includes a center shielding plate including a ferromagnetic material to provide effective magnetic shielding. Thus, the electromagnetic shielding box may prevent an electromagnetic wave from leaking to the outside and prevent an externally introduced magnetic field from passing through a capacitively coupled plasma generation region formed at a lower portion of the electromagnetic shielding box. The center shielding plate disposed at the bottom surface of the electromagnetic shielding box may have a remanent magnetization and change characteristics of its underlying plasma to improve a deposition uniformity.

A capacitively coupled plasma substrate processing apparatus according to an example embodiment of the present disclosure includes: a process chamber which is exhausted to vacuum and provides a sealed internal space; a gas inlet which is connected to the process chamber to provide a process gas into the process chamber; a gas distribution unit which is connected to the gas inlet to inject the process gas flowing into the gas inlet in the internal space; an impedance matching network which is disposed outside the process chamber and transfers an RF power of an RF power supply to the gas distribution unit; an RF connection line which connects an output of the impedance matching network to the gas inlet or the gas distribution unit; and a shielding plate which is configured such that at least one of the RF connection line and the gas inlet penetrates the shielding plate and includes a ferromagnetic material.

In an example embodiment of the present disclosure, the shielding plate may include a bottom non-magnetic conductive plate, a middle ferromagnetic plate, and a top non-magnetic conductive plate which are sequentially stacked.

In an example embodiment of the present disclosure, a thickness of the middle ferromagnetic plate may be between 0.1 and 1 millimeter.

In example embodiment of the present disclosure, the shielding plate may be a square plate and is divided into four parts in a matrix format.

In an example embodiment of the present disclosure, a ferromagnetic material of the shielding plate may be an iron-nickel alloy such as PERMALLOY® or mu-metal.

In an example embodiment of the present disclosure, the capacitively coupled plasma substrate processing apparatus may further include: a cooling plate provided on at least one of top and bottom surfaces of the shielding plate to cool the shielding plate.

In an example embodiment of the present disclosure, the shielding plate may include two or more ferromagnetic sheets.

In an example embodiment of the present disclosure, the shielding plate include two or more ferromagnetic sheets whose areas are different from each other.

In an example embodiment of the present disclosure, the shielding plate may include two or more ferromagnetic sheets whose thicknesses are different from each other.

In an example embodiment of the present disclosure, the capacitively coupled plasma substrate processing apparatus may further include: a remote plasma source mounted outside the shielding plate. The remote plasma source may supply a reactive gas to the gas pipe inlet.

BRIEF DESCRIPTION OF THE DRAWINGS

The present disclosure will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

Figure 1:
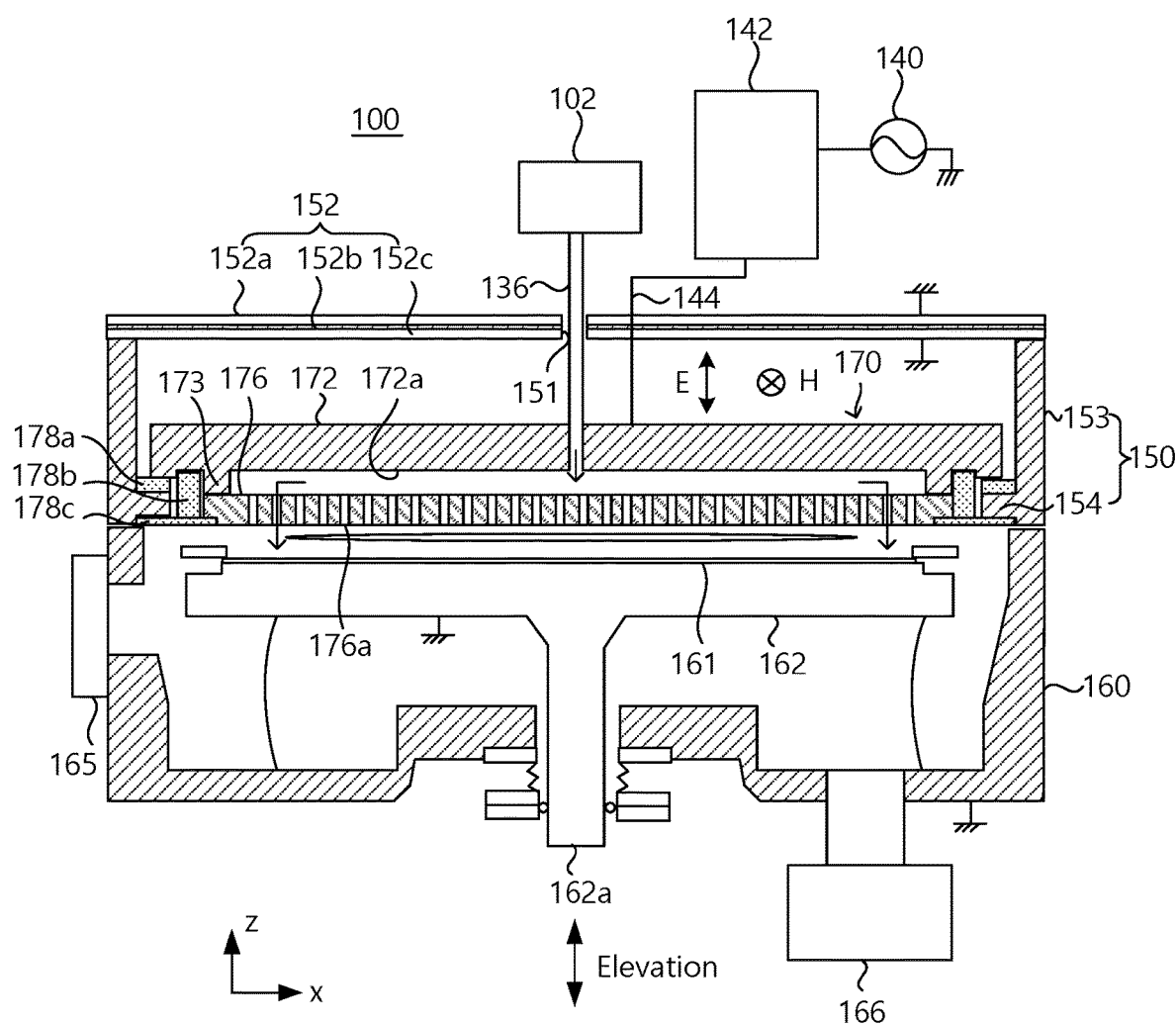
FIG. 1 is a conceptual diagram of a substrate processing apparatus according to an example embodiment of the present disclosure.

A substrate processing apparatus according to an example embodiment of the present disclosure includes a process chamber, a gas distribution unit, and a shielding plate disposed on the process chamber. The gas distribution unit functions as a cover of the process chamber, is supplied with RF power to generate a capacitive plasma inside the process chamber, and is provided with a gas to spatially distribute the gas. When the gas distribution unit is exposed to the outside, the gas distribution unit radiates an electromagnetic field and generates a parasitic capacitance which varies depending on an external environment. Thus, a shielding part formed of a non-magnetic conductor is configured to cover the gas distribution unit. As a result, the shielding part of non-magnetic conductor may shield an electromagnetic wave and stably maintain the parasitic capacitance.

However, the shielding part cannot shield an external static magnetic field or a low-frequency magnetic field. The external static magnetic field or the low-frequency magnetic field may permeate the shielding part of non-magnetic conductor and the gas distribution unit to have an influence on plasma characteristics. On the other hand, a shielding plate firmed of only a ferromagnetic material is heated by an electromagnetic wave to lose characteristics of the ferromagnetic material.

Accordingly, there is a need for a new structure which can simultaneously shield an external static electromagnetic field and a low-frequency magnetic field.

According to an example embodiment of the present disclosure, the shielding plate includes a bottom non-magnetic conductive plate, a middle ferromagnetic plate, and a top non-magnetic conductive plate. The bottom non-magnetic conductive plate and the top non-magnetic conductive plate are grounded, absorb an electromagnetic wave to shield the electromagnetic wave, and are heated. Each of the bottom non-magnetic conductive plate and the top non-magnetic conductive plate has a high thermal conductivity and operates as a cooling plate. The middle ferromagnetic plate is in electric contact with the top non-magnetic conductive plate and the bottom non-magnetic conductive plate to perform an auxiliary electromagnetic shielding function. Thus, most of an RF electromagnetic wave are absorbed at the bottom non-magnetic conductive plate or the top non-magnetic conductive plate. A part of the low-frequency electromagnetic wave is absorbed at the bottom non-magnetic conductive plate or the top non-magnetic conductive plate, and the rest of the low-frequency electromagnetic wave is absorbed at the middle ferromagnetic plate. Since an energy impinging on the middle ferromagnetic plate is small, the middle ferromagnetic plate is almost not inductively heated. Thus, the shielding plate of sandwich structure may effectively shield not only an RF electromagnetic wave but also effectively shield a low-frequency electromagnetic wave and a static magnetic field and may prevent performance degradation caused by heating. The shielding plate may efficiently perform shielding when being simultaneously exposed to an external static magnetic field, an RF electromagnetic wave, and a low-frequency electromagnetic wave.

A substrate processing apparatus according to an example embodiment of the present disclosure includes a gas distribution unit which generates a capacitively coupled plasma using an RF and a remote plasma source using a low frequency between tens of kHz and hundreds of kHz to provide an activated gas to the gas distribution unit. An RF power supply is connected to a gas inlet which supplies an RF power to the gas distribution unit through an impedance matching network. The gas pipe-inlet is disposed inside an electromagnetic shielding box to shield an RF electromagnetic wave generated by an RF current such that the RF electromagnetic wave does not leak to the outside. A low-frequency electromagnetic wave may flow into the electromagnetic shielding box through an outlet of the remote plasma source, and the electromagnetic wave flowing into the electromagnetic shielding box is shielded by a shielding plate of sandwich structure constituting a bottom surface of the electromagnetic shielding box. An external static magnetic field is shielded by a middle ferromagnetic plate formed of a ferromagnetic material. Thus, process uniformity of a process chamber is improved as the magnetic field is shielded. The improvement in the process uniformity is interpreted to result from electromagnetic shielding and/or remanent magnetization of a shielding plate.

Example embodiments will now be described more fully with reference to the accompanying drawings, in which some example embodiments are shown. Example embodiments may, however, be embodied in many different forms and should not be construed as being limited to the embodiments set forth herein; rather, these example embodiments are provided so that this disclosure will be thorough and complete, and will fully convey the scope of example embodiments of the present disclosure to those of ordinary skill in the art. In the drawings, the thicknesses of layers and regions are exaggerated for clarity. Like reference characters and/or numerals in the drawings denote like elements, and thus their description may be omitted.

FIG. 1 is a conceptual diagram of a substrate processing apparatus according to an example embodiment of the present disclosure.

Figure 2:
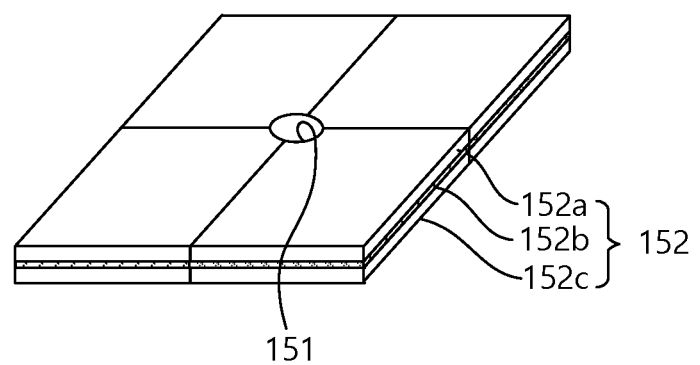
FIG. 2 is a perspective view of a shielding plate in FIG. 1.

FIG. 2 is a perspective view of a shielding plate in FIG. 1,

Referring to FIGS. 1 and 2, a capacitively coupled plasma substrate processing apparatus 100 includes a process chamber 160 which is exhausted to vacuum and provides a sealed internal space, a gas inlet 136 which is connected to the process chamber 160 to provide a process gas into the process chamber 160, a gas distribution unit 170 which is connected to the gas inlet 136 to inject the process gas flowing into the gas inlet 136 in the internal space, an impedance matching network 142 which is disposed outside the process chamber 160 and transfers an RF power of an RF power supply 140 to the gas distribution unit 170, an RF connection line 144 which connects an output of the impedance matching network 142 to the gas inlet 136 or the gas distribution unit 170, and a shielding plate 152 which is configured such that at least one of the RF connection line 144 and the gas inlet penetrates the shielding plate 152 and includes a ferromagnetic material. The shielding plate 152 includes a bottom non-magnetic conductive plate, a middle ferromagnetic plate, and a top non-magnetic conductive plate which are sequentially stacked.

The process chamber 160 is in the form of a rectangular parallelepiped, is formed of a non-magnetic conductive metal, is grounded, is exhausted to vacuum, and provides a sealed internal space. The process chamber 160 may perform a deposition process, an etching process or a surface treatment process on a substrate 161. The substrate 161 may be a square glass substrate of sixth generation (1500×1850 mm) or higher. A square susceptor 162 may be disposed at a lower portion inside the process chamber 160, and the substrate 161 may be placed on the susceptor 162.

A heater (not shown) mounted in the susceptor 162 during deposition of a thin film may increase a substrate temperature to a temperature suitable for the deposition and may be electrically grounded to function as a bottom electrode. A susceptor support 162a extends to a central bottom surface of the susceptor 162. A moving assembly combined with driving means (not shown) such as a motor is combined with an outer circumferential surface of the susceptor support 162a to be vertically elevated as a process is performed. Along with the vertical elevation of the moving assembly, the overlying susceptor 162 may be vertically elevated repeatedly.

The susceptor 162 may be connected to a plurality ground strips to be electrically grounded with a bottom surface of the process chamber 160. A gate valve 165 may be disposed on one side surface of the process chamber 160 to provide a passage for loading the substrate 161 into the process chamber 160.

An exhaust pipe connected to an exhaust pump 166 is mounted on one side bottom surface of the process chamber 160 to exhaust a gas remaining in the process chamber 160 to the outside before and after deposition and cleaning processes.

A lid frame 150 may be disposed on a top surface of the process chamber 160 to mount the gas distribution unit 170. The lid frame 150 may include a plate-shaped bottom lid frame 154 having a through-hole into which the gas distribution unit 170 may be inserted to be mounted and a lid frame sidewall 153 extending from the bottom lid frame 154 in a vertical direction. The bottom lid frame 154 may be in the form of a square ring. The lid frame sidewall 153 may be in the form of a square tube to cover the sidewall of the gas distribution unit 170. The lid frame 150 may be formed of a non-magnetic conductive metal such as aluminum.

The gas distribution unit 170 is inserted into the through-hole of the lid frame 150 to function as a cover of the process chamber 160 and spatially distributes a gas supplied to the gas inlet 136 to the inside of the process chamber 160. The gas distribution unit 170 may be formed of a non-magnetic conductive material. The gas distribution unit 170 may include a backing plate 172, a shower head 176, and insulating members 178a, 178b, and 178c which electrically insulate the gas distribution unit 170 and the lid frame 150. A protrusion 173 may be disposed along a bottom surface edge of the backing plate 172. The protrusion 173 may be in the form of a square ring. The protrusion 173 may has a constant distance from an outermost portion of the backing plate 172 and may be disposed at an inner side of a bottom surface of the backing plate 172. An outer side of the protrusion 173 may be inserted into the through-hole of the bottom lid frame 154.

The shower head 176 may be formed of a conductive material, be in the form of a square plate, and include a plurality of nozzles 176a. The shower head 176 and the backing plate 172 may be fixedly coupled with each other.

An outer circumferential surface of the shower head 176 may be aligned with the protrusion 173 of the backing plate 172 to provide a gas buffer space 172a. The gas buffer space 172a may provide a space in which a gas may be diffused.

The bottom surface edge of the backing plate 172 may be disposed to be locked to the through-hole of the bottom lid frame 154. A washer-shaped first insulating member 178a may be disposed between the bottom surface edge of the backing plate 172 and the bottom lid frame 154 to achieve electrical insulation therebetween.

A second insulating member 178b may be disposed between the bottom lid frame 154 and a side surface of the shower head 176 to achieve electrical insulation therebetween. A third insulating member 178c may be disposed on a bottom surface edge of the shower head 176 and a bottom surface of the bottom lid frame 154. The third insulating member 178c may be formed of ceramic.

The gas inlet 136 may receive a gas from a gas supply 102 and supply the gas to the gas distribution unit 170. The gas inlet 136 may penetrate the center of the shielding plate 152 to be connected to the center of the gas distribution unit 170. When the gas inlet 136 is a conductor, an RF power may be transferred to the gas distribution unit 170 through the gas inlet 136.

The shielding plate 152 may function as a cover of the lid frame 150 and shield an electric field generated in the gas distribution unit 170. The shielding plate 152 may have a through-hole 151 formed in its center. The gas 136 may vertically penetrate the through-hole 151 to be connected to the center of the backing plate 172. The shielding plate 152 mounted on the lid frame 150 functions as a cover of the lid frame 150. The gas distribution unit 170 and the shielding plate 152 may be modeled as a parallel plate capacitor. The shielding plate 152 includes a bottom non-magnetic conductive plate 152c, a middle ferromagnetic plate 152b, and a top non-magnetic conductive plate 152a which are sequentially stacked. The bottom non-magnetic conductive plate 152c, the lid frame sidewall 153, and the backing plate 172 constitute a cavity. In the cavity, an RF electric field E of a vertical direction (z-axis direction) is generated and an RF magnetic field H of an azimuthal direction is generated. Due to the RF magnetic field, a surface current of a radial direction flows to a bottom surface of the bottom non-magnetic conductive plate 152c. In order not to cut off the flow of the surface current, the shielding plate 152 may include a plurality of parts cut in the radial direction. More specifically, when the shielding plate 152 is a square plate, it may be divided into four parts in a matrix format. The bottom non-magnetic conductive plate 152c, the middle ferromagnetic plate 152b, and the top non-magnetic conductive plate 152a may be aligned with each other. The middle ferromagnetic plate 152b may include an iron-nickel alloy such as PERMALLOY® or mu-metal. A thickness of the middle ferromagnetic plate 152b may be between 0.1 and 1 millimeter (mm). The bottom non-magnetic conductive plate 152c may be an aluminum plate having a thickness of several millimeters or more.

In the case of aluminum, a skin depth of an electromagnetic wave may be about 0.1 mm at a frequency of 1 MHz. In the case of the iron-nickel alloy, the skin depth of the electromagnetic wave may be about 0.001 mm at a frequency of 1 MHz. That is, at the same frequency of 1 MHz, a skin depth of the iron-nickel alloy may be about 100 times smaller than a skin depth of aluminum. If the shielding plate 152 is formed of only a ferromagnetic material that is thicker than the skin depth, the shielding plate 152 is absorb an electromagnetic wave in the early stage but may be heated to lose shielding characteristics with the lapse of time.

However, according to an example embodiment of the present disclosure, the shielding plate 152 includes the bottom non-magnetic conductive plate 152c for cooling and shielding an electromagnetic wave. The bottom non-magnetic conductive plate 152c may have a high electric conductivity and induce a surface current to shield an electromagnetic wave. The electromagnetic wave passing through the bottom non-magnetic conductive plate 152c may be fully shielded at the middle ferromagnetic plate 152b. The electromagnetic wave reaching the middle ferromagnetic plate is already attenuated by the bottom non-magnetic conductive plate 152c. Thus, the middle ferromagnetic plate 152b may fully shield the electromagnetic wave without being heated sufficiently, Since the bottom non-magnetic conductive plate 152c includes a metal such as aluminum having a high thermal conductivity, it may be cooled through heat transfer. The middle ferromagnetic plate 152b may stably shield an electromagnetic wave without variation of characteristics caused by induction heating.

The top non-magnetic conductive plate 152a may be disposed on the middle ferromagnetic plate 152b to shield an RF electromagnetic wave generated at the outside of the cavity. The top non-magnetic conductive plate 152a has a thickness greater than a skin depth and absorbs most electromagnetic wave energy. The rest energy of the electromagnetic wave passing through the top non-magnetic conductive plate 152a is absorbed in the middle ferromagnetic plate 152b. Thus, the middle ferromagnetic plate 152b may perform electromagnetic shielding without being heated sufficiently.

The middle ferromagnetic plate 152b may shield a static magnetic field generated at the outside of the cavity and a low-frequency magnetic field passing through the top non-magnetic conductive plate 152a. A thickness of the bottom non-magnetic conductive plate 152c may be at least 10 times greater than a thickness of the middle ferromagnetic plate 152b. A thickness of the top non-magnetic conductive plate 152a may be at least 10 times greater than the thickness of the middle ferromagnetic plate 152b to shield a strong electromagnetic wave on the top non-magnetic conductive plate 152a.

The RF power supply 140 may be disposed outside the shielding part and supply an RF power to the gas distribution unit 170 to generate a capacitively coupled plasma. The gas distribution unit 170 may generate a capacitively coupled plasma while distributing a gas to a bottom surface of the shower head 176. A frequency of the RF power supply 140 may be between several MHz and tens of MHz. The RF power of the RF power supply 140 may be transferred to the impedance matching network 142 through a coaxial cable.

The impedance matching network 142 is disposed outside the shielding plate 152 and maximally transfers the RF power of the RF power supply to the gas distribution unit 170. The impedance matching network 142 may include at least two variable reactance components and control a reactance of the variable reactance component to transfer maximum power to a load. The impedance matching network 142 may be shielded by a conductive box.

The RF connection line 144 may transmit an output of the impedance matching network 142 to the gas distribution unit 170. The RF connection line 144 may be a strip line type copper belt or coaxial cable structure. When the RF connection line 144 is directly exposed to the outside, the RF connection line 144 may provide an RF electromagnetic wave at the outside of the cavity. The shielding plate 152 of sandwich structure may efficiently shield an electromagnetic wave and an external magnetic field.

According to a modified embodiment of the present disclosure, the capacitively coupled plasma substrate processing apparatus 100 may further include a cooling plate provided on at least one of top and bottom surfaces of the shielding plate 152 to cool the shielding plate 152. The cooling plate may be a non-magnetic conductor. The cooling plate may integrate with the top non-magnetic conductive plate or the bottom non-magnetic conductive plate when performing cooling and electromagnetic shielding at the same time. More specifically, the cooling plate may include aluminum or copper. Preferably, a thickness of the cooling plate may be greater than a skin depth of the electromagnetic wave. The cooling plate may be aligned with the shielding plate 152.

According to a modified embodiment of the present disclosure, the shielding plate 152 may include two or more ferromagnetic sheets stacked with each other. The ferromagnetic sheets may have different frequency characteristics or different thicknesses. The total thickness of the ferromagnetic sheets may be greater than a skin depth of an electromagnetic wave.

According to a modified embodiment of the present disclosure, the shielding plate 152 may further include two or more ferromagnetic sheets. The ferromagnetic sheets may be disposed adjacent to each other to wholly constitute a single plate. The shielding plate 152 may be spatially divided to provide different characteristics according to positions. A coupling portion of the ferromagnetic sheets may extend parallel to a surface current direction. Areas of the ferromagnetic sheets may be different from each other.

Figure 3:
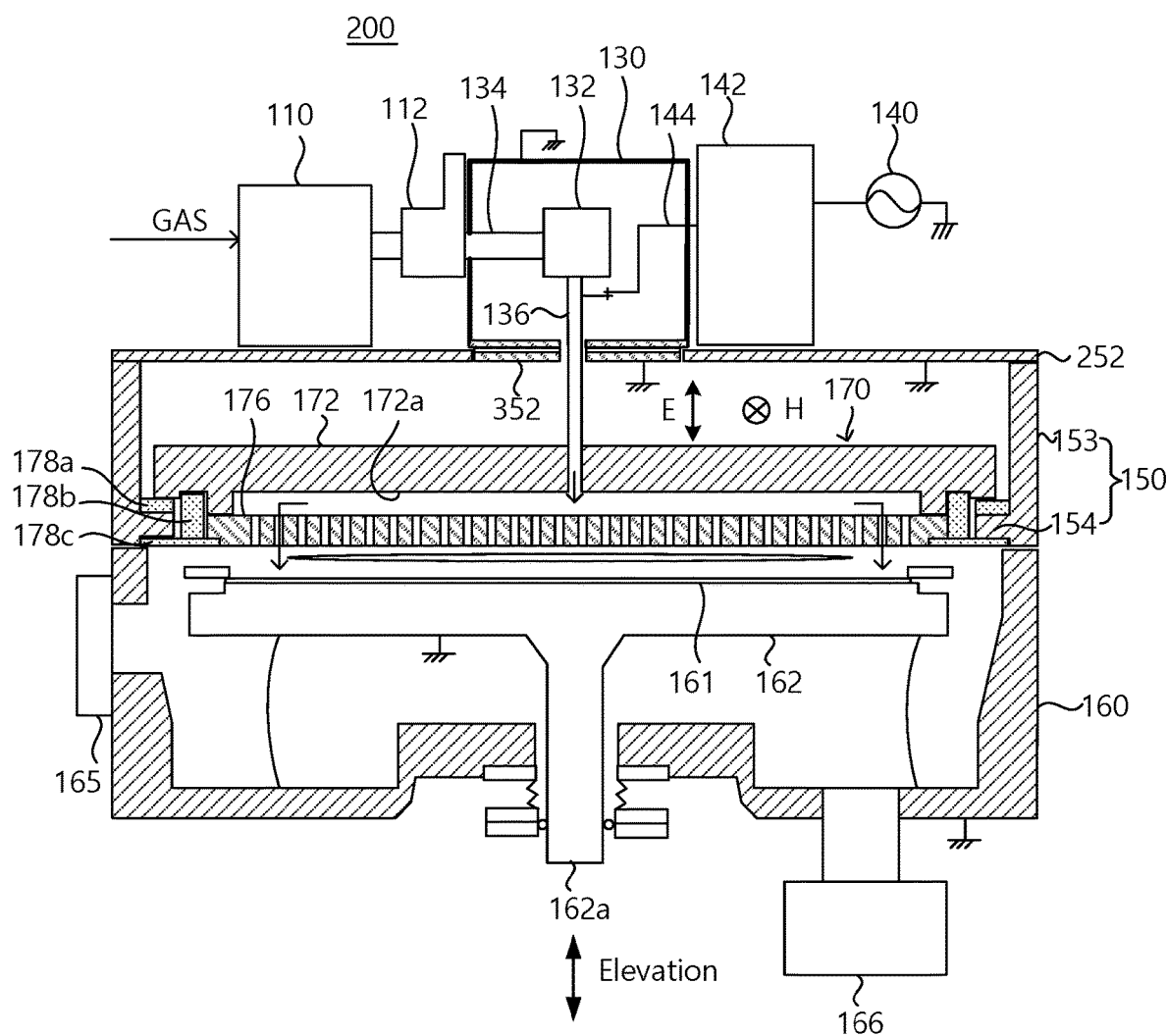
FIG. 3 is a conceptual diagram of a substrate processing apparatus according to another example embodiment of the present disclosure.

FIG. 3 is a conceptual diagram of a substrate processing apparatus according to another example embodiment of the present disclosure.

Figure 4:
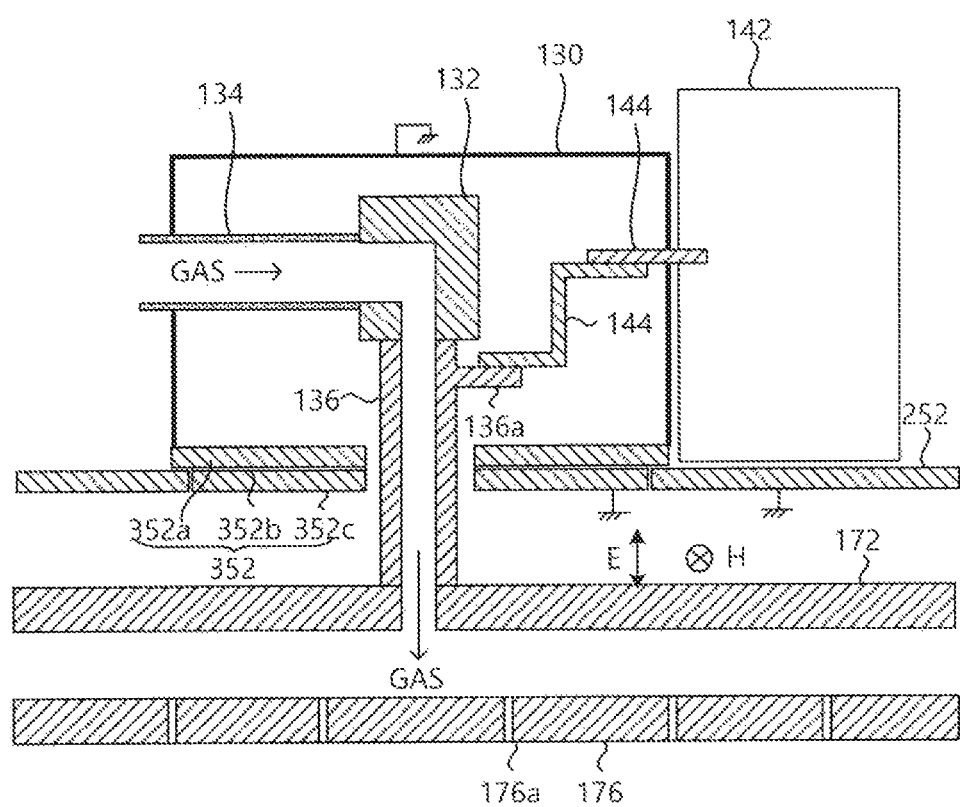
FIG. 4 is a cross-sectional view of an electromagnetic shielding box in FIG. 3.

FIG. 4 is a cross-sectional view of an electromagnetic shielding box in FIG. 3.

Figure 5:
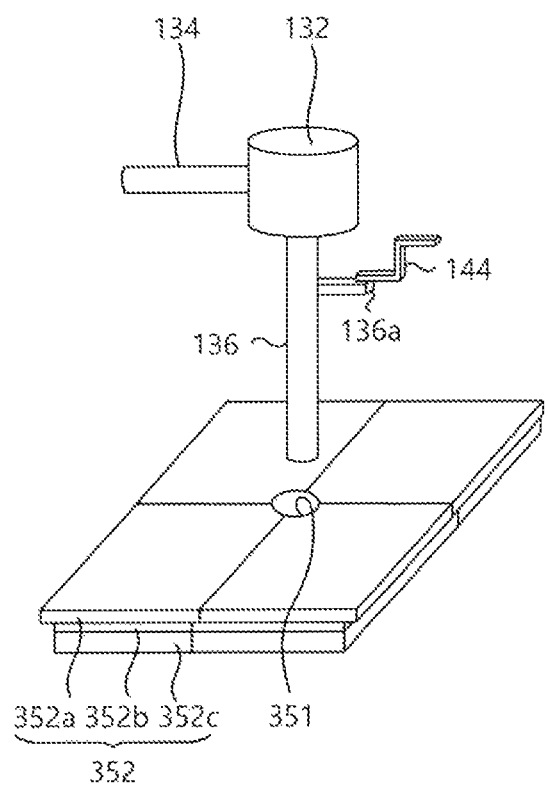
FIG. 5 is a perspective view of a gas inlet and a center shielding plate inside the electromagnetic shielding box in FIG. 4.

FIG. 5 is a perspective view of a gas inlet and a center shielding plate inside the electromagnetic shielding box in FIG. 4.

Referring to FIGS. 3 to 5, a substrate processing apparatus 200 includes a process chamber 160 which is exhausted to vacuum and provides a sealed internal space, a gas inlet 136 which is connected to the process chamber 160 to provide a process gas into the process chamber 160, a gas distribution unit 170 which is connected to the gas inlet 136 to inject a process gas flowing into the gas inlet 136 in the internal space, an impedance matching network 142 which is disposed outside the process chamber 160 and transfers an RF power of an RF power supply 140 to the gas distribution unit 170, an RF connection line 144 which connects an output of the impedance matching network 142 to the gas inlet 136 or the gas distribution unit 170, and a shielding plate 352 which is configured such that at least one of the RF connection line 144 and the gas inlet 136 penetrates the shielding plate 352 and includes a ferromagnetic material.

A lid frame cover 252 may be disposed on a top surface of a lid frame 150 to provide a sealed space maintained at atmospheric pressure. The lid frame cover 252 may have a through-hole formed in its central region. The shielding plate 352 may be in the form of a single square plate which is not divided and may be formed of a non-magnetic conductor. The lid frame cover 252 may be in electrical contact with the shielding plate 352. The lid frame cover 252 and the shielding plate 352 may face a backing plate 172 and operate as a parallel plate capacitor. The shielding plate 352 and the lid frame cover 252 may be electrically connected to each other such that a surface current of a radial direction may continuously flow.

The shielding plate 352 may function as a portion of a cover of the lid frame 150 and shield an electric field generated in the gas distribution unit 170. The shielding plate 352 may have a through-hole 351 formed in its center. The gas inlet 136 may vertically penetrate the through-hole 351 to be connected to the center of the backing plate 172. The lid frame cover 252 and the shielding plate 352 function as a cover of the lid frame 150.

The shielding plate 352 includes a bottom non-magnetic conductive plate 352c, a middle ferromagnetic plate 352b, and a top non-magnetic conductive plate 352a which are sequentially stacked. An RF electric field E of a vertical direction (z-axis direction) is generated below the shielding plate 352, and an RF magnetic field H of an azimuthal direction is generated. Due to the RF magnetic field H, a surface current of the radial direction flows to a bottom surface of the bottom non-magnetic conductive plate 352c.

In order not to cut off the flow of the surface current, the shielding plate 352 may include a plurality of parts cut in the radial direction. More specifically, when the shielding plate 152 is a square plate, it may be divided into four parts in a matrix format. The bottom non-magnetic conductive plate 352c, the middle ferromagnetic plate 352b, and the top non-magnetic conductive plate 352a may be aligned with each other. The middle ferromagnetic plate 352b may include an iron-nickel alloy such as PERMALLOY® or mu-metal. A thickness of the middle ferromagnetic plate 352b may be between 0.1 and 1 millimeter (mm). The bottom non-magnetic conductive plate 152c may be an aluminum plate having a thickness of several millimeters or more. A bottom surface of the top non-magnetic conductive plate 352a may be the same plane as a top surface of the lid frame cover 252. The bottom surface of bottom non-magnetic conductive plate 352c may be the same plane as a top surface of the lid frame cover 252.

The shielding plate 352 is disposed in a central region of the lid frame cover 252. The shielding plate 352 may be a square plate with a side length of tens of centimeters. The shielding plate 352 may be divided into four parts in a matrix format so as to achieve ease of disassembly and assembly and so as not to interfere with flow of the surface current. The shielding plate 352 may include a top non-magnetic conductive plate 352a, a middle ferromagnetic plate 352b, and a bottom non-magnetic conductive plate 352c which are sequentially stacked. The top non-magnetic conductive plate 352a, the middle ferromagnetic plate 352b, and the bottom non-magnetic conductive plate 352c may be a sandwich structure. The middle ferromagnetic plate 352b may have a thickness between 0.1 and 1 millimeter, and each of the top and bottom non-magnetic conductive plates 352a and 352c may have a thickness between several millimeters and tens of millimeters and be formed of aluminum. The shielding plate 352 may have a through-hole 351 in its center to extend the gas inlet 136. The middle ferromagnetic plate 352b may include an iron-nickel alloy such as PERMALLOY® or mu-metal. A thickness of the shielding plate 352 may be between several millimeters and tens of millimeters. The top non-magnetic conductive plate 352a may constitute a cavity together with an electromagnetic shielding box to prevent leakage of an RF electromagnetic wave. The middle ferromagnetic plate 352b formed of an iron-nickel alloy such as PERMALLOY® may shield an electromagnetic wave and shield an external static magnetic field. Thus, the shielding plate 352 may improve plasma uniformity or process uniformity.

The RF connection line 144 and/or the gas inlet 136 connected to the RF connection line 144 may operate as a source to generate an RF electromagnetic wave. The RF connection line 144 and the gas inlet 136 may be disposed on the shielding plate 352. The shielding plate 352 may shield an RF electromagnetic wave generated at the RF connection line 144 and the gas inlet 136 connected to the RF connection line 144.

A remote plasma source 110 is mounted outside the shielding plate 352. The remote plasma source 110 may be disposed on the shielding plate 352. Conventionally, the remote plasma source 110 may use an inductively coupled plasma source with a frequency of several KHz to hundreds of KHz. The remote plasma source 110 externally receives a gas and activates the gas using an inductively coupled plasma. The activated gas is supplied to the process chamber 160 through the gas inlet 136 and the gas distribution unit 170. A path between an output terminal of the remote plasma source 110 and the process chamber 160 is preferably short to efficiently supply the activated gas to the process chamber. Accordingly, the remote plasma source 110 is preferably disposed at the shielding plate 352. The remote plasma source 110 may generate a low-frequency magnetic field. The low-frequency magnetic field passes through a ring-shaped remote plasma generation container formed of a metal to generate an inductively coupled plasma in the ring-shaped container. In the case of aluminum, a skin depth of a low-frequency electromagnetic wave may be about 1 millimeter at a frequency of 10 KHz. A thickness of the ring-shaped container is about several millimeters, and the low-frequency magnetic field passes through the ring-shaped container to generate an inductively coupled plasma in the ring-shaped container. Thus, an electromagnetic wave radiated from the remote plasma source 110 using a low frequency between tens of KHz and hundreds of KHz may be provided to the shielding plate 352. The shielding plate 352 may shield the low-frequency electromagnetic wave.

An electromagnetic shielding box 130 may be disposed to cover the RF connection line 144 and/or the gas inlet 136 connected to the RF connection line 144. The shielding plate 352 may function as a bottom surface of the electromagnetic shielding box 130. A side surface and a top surface of the electromagnetic shielding box 130 may formed of a conventional non-magnetic material. Thus, the side surface and the top surface of the electromagnetic shielding box 130 may be a non-magnetic conductive metal to prevent an electromagnetic wave generated therein from leaking to the outside. A bottom surface of the electromagnetic shielding box 130 may include the shielding plate 352 to shield an electromagnetic wave provided from an upper portion of the shielding plate 352 and shield an electromagnetic wave provided from a lower portion of the shielding plate 352.

The gas inlet 136 is connected to the process chamber through the center of the shielding plate 352 to receive a reactive gas from the remote plasma source 110 and provide the reactive gas into the process chamber 160. The gas inlet 136 may be an aluminum or copper pipe having a high electrical conductivity to efficiently transfer an RF power. The gas inlet 136 may vertically penetrate the center of the shielding plate 352 to be connected to the gas distribution unit 170. The gas inlet 136 is disposed so as not to be in electrical and direct contact with the grounded shielding plate 352. The shielding plate 352 and the lid frame cover 252 are grounded for efficient electromagnetic shielding.

One end of the gas inlet 136 is connected to a 90-degree elbow duct 132 formed of a conductive metal. The 90-degree elbow duct 132 may turn a gas flow direction 90 degrees.

The 90-degree elbow duct 132 may be connected to an insulating tube 134 extending in a horizontal direction. The insulating tube 134 may be formed of ceramic such as alumina. The insulating tube 134 may prevent the RF power from being transferred to the remote plasma source 110. The insulating tube 134 may extend through the side surface of the electromagnetic shielding box 130.

The insulating tube 134 may be connected to a cooling block 112. The cooling block 112 may cool a pipe heated by a high-temperature gas flowing out of the remote plasma source 110. The cooling block 112 may employ a water-cooling method. The cooling block 112 may be connected to an outlet of the remote plasma source 110.

The RF connection line 144 may connect an output of the impedance matching network 142 to the gas inlet 136. The RF connection line 144 may be a strip line type copper belt. The RF connection line 144 may be electrically connected to a connection terminal 136a. The RF connection line 144 may be divided into a plurality of parts to achieve ease of disassembly and assembly.

The connection terminal 136a may be disposed to protrude from a side surface of the gas inlet 136 and may be formed of a conductive material.

The electromagnetic shielding box 130 uses the shielding plate 352 as a bottom surface and is configured to cover the RF connection line 144 and the gas inlet 136. A side surface and a top surface of the electromagnetic shielding box are formed of a non-magnetic conductive material. The electromagnetic shielding box 130 may be disposed to cover the 90-degree elbow duct 132, the RF connection line 144, and the insulating tube 134.

The electromagnetic shielding box 130 and the shielding plate 352 may shield an electromagnetic wave and a static magnetic field to improve process stability and plasma process stability.

Figure 6A:
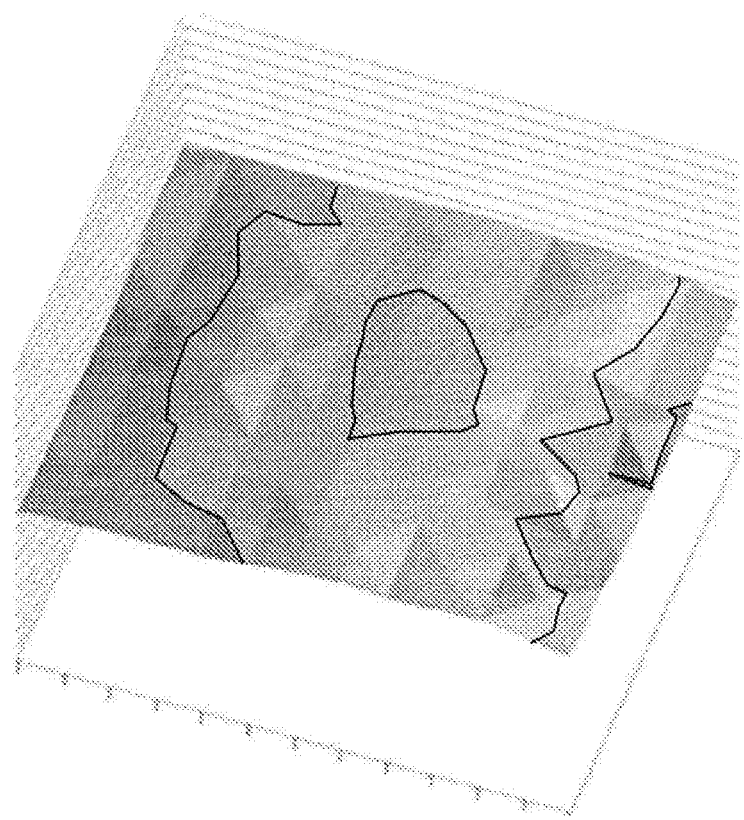
FIGS. 6A and 6B show test results indicating deposition uniformities of silicon nitride e when a non-magnetic conductive shielding plate disposed on a bottom surface of an electromagnetic shielding box is used and when a shielding plate of a sandwich structure according to an example embodiment of the present disclosure is used, respectively.
Figure 6B:
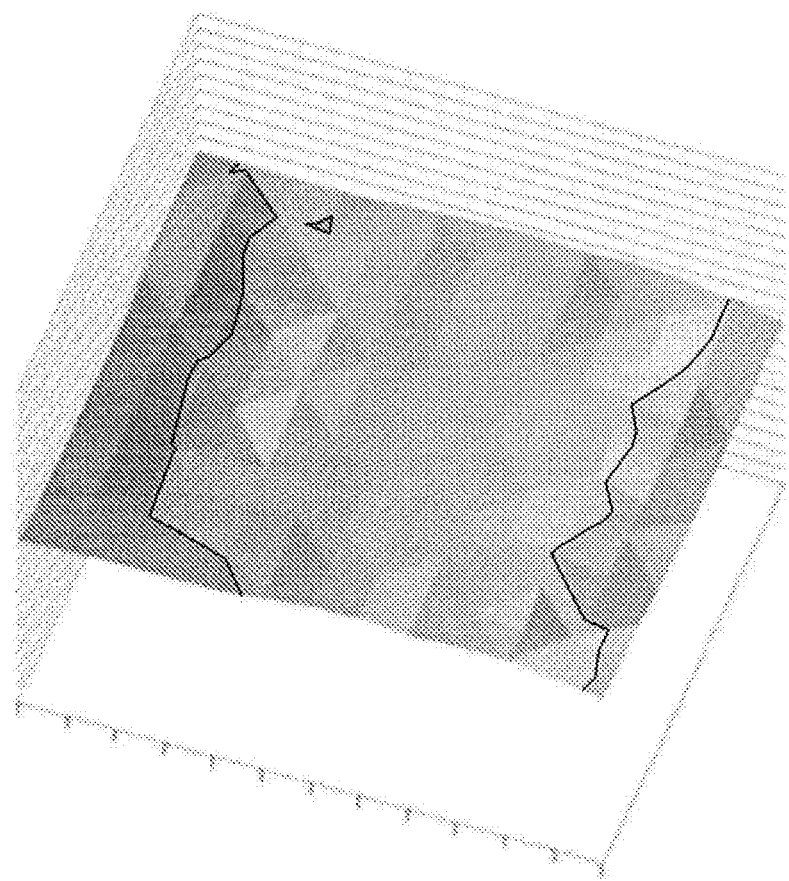

FIGS. 6A and 6B show test results indicating deposition uniformities of silicon nitride e when a non-magnetic conductive shielding plate disposed on a bottom surface of an electromagnetic shielding box is used and when a shielding plate of a sandwich structure is used according to an example embodiment of the present disclosure, respectively.

Referring to FIGS. 3 and 6A, when only a non-magnetic conductive shielding plate is used at a bottom surface of an electromagnetic shielding box in a substrate processing apparatus, deposition uniformity of silicon oxide was 7.4 percent and mean thickness of the silicon oxide was 3236 angstroms (Å).

Referring to FIGS. 3 and 6B, when a shielding plate 352 including a top non-magnetic conductive plate, a middle ferromagnetic plate, and a bottom non-magnetic conductive plate is used at a bottom surface of an electromagnetic shielding box in a substrate processing apparatus, deposition uniformity of silicon oxide was 5.7 percent and mean thickness of the silicon oxide was 3225 angstroms (Å).

Figure 7:
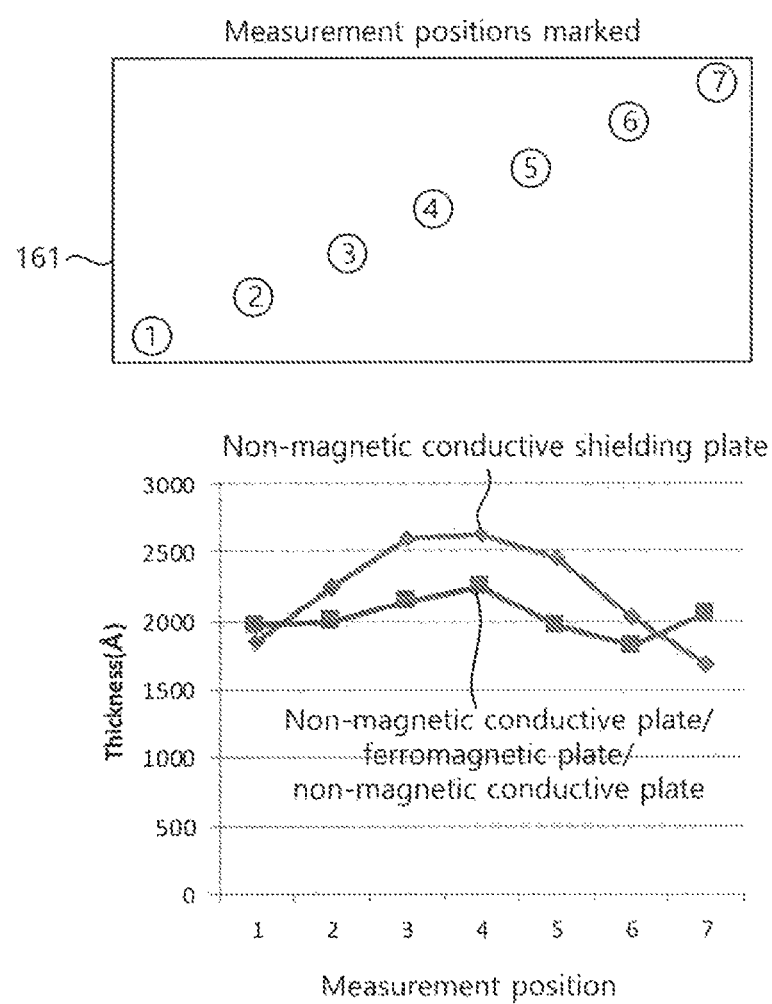
FIG. 7 shows a test result indicating a deposition thickness of silicon nitride at a plurality of measurement positions in a diagonal direction of a substrate.

FIG. 7 shows a test result indicating a deposition thickness of silicon nitride at a plurality of measurement positions in a diagonal direction of a substrate.

Referring to FIGS. 3 and 7, spatial uniformity of a diagonal direction of a substrate depending on a shielding plate 325 of sandwich structure or a non-magnetic conductive shielding plate was measured. As the shielding plate of sandwich structure is used, deposition uniformity is improved.

As described above, a substrate processing apparatus according to example embodiments of the present disclosure may improve deposition process uniformity or capacitively coupled plasma processing uniformity by using an electromagnetic shielding box that provides an electromagnetic shielding function and remanent magnetization.

Although the present disclosure and its advantages have been described in detail, it should be understood that various changes, substitutions and alterations can be made herein without departing from the spirit and scope of the disclosure as defined by the following claims.

What is claimed is:

1. A capacitively coupled plasma substrate processing apparatus comprising:
    a process chamber which is exhausted to vacuum and provides a sealed internal space;
    an electromagnetic shielding box having a grounded shielding plate as a bottom surface;
    a gas inlet which is inside the electromagnetic shielding box and connected to the process chamber to provide a process gas into the process chamber;
    a gas distribution unit which is connected to the gas inlet to inject the process gas flowing into the gas inlet in the internal space;
    an impedance matching network which is outside the process chamber and transfers an RF power of an RF power supply to the gas distribution unit; and
    an RF connection line which connects an output of the impedance matching network to the gas inlet or the gas distribution unit;
    a lid frame on a top surface of the process chamber to mount the gas distribution unit
    a lid frame cover on a top surface of the lid frame, the lid frame cover having a through-hole; wherein:
        wherein the shielding plate includes, in sequence, a bottom non-magnetic conductive plate, a middle plate comprising a ferromagnetic material, and a top non-magnetic conductive plate, and is configured such that the gas inlet penetrates the shielding plate, the shielding plate is exposed to an RF electromagnetic wave, each of the bottom non-magnetic conductive plate and the top non-magnetic conductive plate has a thickness that is (i) greater than a skin depth, (ii) between several millimeters and tens of millimeters, and (iii) at least 10 times greater than a thickness of the middle plate, and the thickness of the middle plate is between 0.1 and 1 millimeter,
        the impedance matching network is on the lid frame cover, and
        the shielding plate is on the through-hole of the lid frame cover.

2. The capacitively coupled plasma substrate processing apparatus as set forth in claim 1, wherein
    the shielding plate is a square plate and is divided into four parts in a matrix format.

3. The capacitively coupled plasma substrate processing apparatus as set forth in claim 1, wherein
    the ferromagnetic material of the shielding plate is an iron-nickel alloy or mu-metal.

4. The capacitively coupled plasma substrate processing apparatus as set forth in claim 1, further comprising:
    a cooling plate on at least one of top and bottom surfaces of the shielding plate to cool the shielding plate.

5. The capacitively coupled plasma substrate processing apparatus as set forth in claim 1, wherein
    the shielding plate includes two or more ferromagnetic sheets.

6. The capacitively coupled plasma substrate processing apparatus as set forth in claim 5, wherein
the two or more ferromagnetic sheets have areas that are different from each other.

7. The capacitively coupled plasma substrate processing apparatus as set forth in claim 5, wherein
the two or more ferromagnetic sheets have thicknesses that are different from each other.

8. The capacitively coupled plasma substrate processing apparatus as set forth in claim 1, further comprising:
a remote plasma source mounted outside the electromagnetic shielding box, wherein the remote plasma source supplies a reactive gas to the gas inlet.

9. The capacitively coupled plasma substrate processing apparatus as set forth in claim 1, wherein a side surface and a top surface of the electromagnetic shielding box comprise a non-magnetic conductive material.

10. The capacitively coupled plasma substrate processing apparatus as set forth in claim 1, wherein:
the through-hole is in a central region of the lid frame cover,
the shielding plate and the lid frame cover are electrically connected to each other such that a surface current continuously flows in a radial direction.

11. The capacitively coupled plasma substrate processing apparatus as set forth in claim 1, wherein the bottom non-magnetic conductive plate faces the gas distribution unit and shields an electric field generated in the gas distribution unit.

12. The capacitively coupled plasma substrate processing apparatus as set forth in claim 1, wherein the gas distribution unit includes a backing plate, a shower head, and a plurality of insulating members that electrically insulate the gas distribution unit.

13. The capacitively coupled plasma substrate processing apparatus as set forth in claim 1, wherein the electromagnetic shielding box further comprises a sidewall and a top surface, each comprising a non-magnetic, conductive metal.

14. The capacitively coupled plasma substrate processing apparatus as set forth in claim 13, wherein the electromagnetic shielding box is configured to prevent an external magnetic field from passing through a capacitively coupled plasma generation region at a lower portion of the electromagnetic shielding box.

15. The capacitively coupled plasma substrate processing apparatus as set forth in claim 1, wherein the RF connection line comprises a copper belt or coaxial cable.

16. The capacitively coupled plasma substrate processing apparatus as set forth in claim 1, wherein the RF connection line connects the output of the impedance matching network to the gas inlet, and the gas inlet comprises a conductor configured to transfer the RF power to the gas distribution unit through the gas inlet.

17. The capacitively coupled plasma substrate processing apparatus as set forth in claim 1, wherein the bottom non-magnetic conductive plate comprises aluminum.

18. The capacitively coupled plasma substrate processing apparatus as set forth in claim 1, wherein the skin depth is at a frequency of the RF electromagnetic wave.

19. The capacitively coupled plasma substrate processing apparatus as set forth in claim 1, wherein the bottom non-magnetic conductive plate has a thermal conductivity sufficient to cool the shielding plate by heat transfer.

20. The capacitively coupled plasma substrate processing apparatus as set forth in claim 1, wherein the through-hole is in a central region of the lid frame cover, and the impedance matching network is directly on the lid frame cover.

* * * * *